United States Patent [19]

Enomoto et al.

[11] Patent Number: 5,344,899

[45] Date of Patent: Sep. 6, 1994

[54] PHENOLIC RESIN, METHOD FOR PRODUCING THE RESIN AND EPOXY RESIN COMPOSITION FOR ENCAPSULATION

[75] Inventors: Masami Enomoto; Susumu Kubota; Fumiaki Oshimi; Hitoshi Yuasa; Yutaka Otsuki, all of Yokohama, Japan

[73] Assignee: Nippon Oil Co., Ltd., Tokyo, Japan

[21] Appl. No.: 18,081

[22] Filed: Feb. 16, 1993

Related U.S. Application Data

[62] Division of Ser. No. 856,553, Mar. 24, 1992, abandoned.

[30] Foreign Application Priority Data

Mar. 29, 1991 [JP] Japan .................................. 3-066919

[51] Int. Cl.$^5$ ............................................ C08F 283/00
[52] U.S. Cl. ...................................... 525/534; 525/529; 528/87; 528/97; 528/101; 528/104; 528/205
[58] Field of Search ............... 525/534, 529; 528/205, 528/87, 97, 101, 104

[56] References Cited

U.S. PATENT DOCUMENTS

| | | | |
|---|---|---|---|
| 2,752,403 | 6/1956 | Schutze et al. | 585/366 |
| 4,390,680 | 6/1983 | Nelson | 528/101 |
| 4,394,497 | 7/1983 | Nelson et al. | 528/101 |
| 4,440,914 | 4/1984 | Helfand et al. | 525/486 |
| 4,707,526 | 11/1987 | Sasaki et al. | 528/205 |
| 4,927,905 | 5/1990 | Bogan | 528/205 |
| 5,137,940 | 8/1992 | Tomiyoshi et al. | 523/443 |

FOREIGN PATENT DOCUMENTS 62-104830  5/1987  Japan.

Primary Examiner—John C. Bleutge
Assistant Examiner—Randy Gulakowski
Attorney, Agent, or Firm—Darby & Darby

[57] ABSTRACT

A phenolic resin is represented by the formula (1)

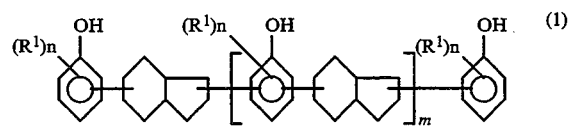

wherein $R^1$ denotes a hydrogen atom or an alkyl group having 1 to 4 carbon atoms, m denotes an integer of from 0 to 10 and n denotes 0, 1 or 2. A method for producing the phenolic resin involves reacting in the presence of an acid catalyst 3a,4,7,7a-tetrahydroindene and a phenol represented by the formula (2)

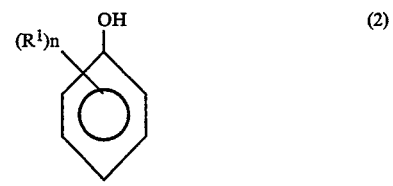

wherein $R^1$ denotes a hydrogen atom or an alkyl group having 1 to 4 carbon atoms and n denotes 0, 1 or 2. An epoxy resin composition for encapsulation contains: (a) a curable epoxy resin, (b) the above phenolic resin, (c) a curing promotor, and (d) an inorganic filler.

11 Claims, 2 Drawing Sheets

PHENOLIC RESIN, METHOD FOR PRODUCING THE RESIN AND EPOXY RESIN COMPOSITION FOR ENCAPSULATION

This is a division of application Ser. No. 07/856,553, filed Mar. 24, 1992, now abandoned as of May 17, 1993.

BACKGROUND OF THE INVENTION

This invention relates to a novel phenolic resin, a method for producing the resin, and an epoxy resin composition for encapsulation containing the phenolic resin as an essential component, wherein the composition is superior in mechanical and electrical characteristics, moisture proofness, thermal resistance, impact resistance and resistance to cracking even when subjected to severe temperature fluctuations.

Recently, in keeping up with the rapid progress in scientific technology centered around the electronic industry, a more and more stringent demand is placed on the properties of products and the starting materials. Above all, in the field of semiconductors the degree of integration is becoming higher rapidly and, in keeping pace therewith, the interconnection is becoming finer and the chip is becoming larger in size. On the other hand, as the degree of integration of semiconductor devices becomes higher, surface mounting tends to be preferred rather than through-hole mounting. In an automation line of surface mounting, semiconductor packages tend to suffer acute temperature changes during soldering of lead lines to produce cracks in molding resins or the resin interface region between the lead lines is deteriorated to lower moisture proofness.

For overcoming the above problems, the methods of adding silicone compounds or thermoplastic oligomers or of silicone modification have been proposed with a view to releasing thermal impact at the time of immersing semiconductor packages in a soldering bath. However, with these methods, resin compositions for encapsulating semiconductors which are reliable in use have not been produced because cracks are developed in the molded products after immersion in the soldering bath.

In the resin compositions for encapsulating semiconductors, phenolic resins are used as a curing agent for epoxy resins. As these phenolic resins, novolak phenolic resins or novolak cresol resins are employed. However, the phenolic resins suffer from a drawback that the semiconductor packages exhibit strong hygroscopic properties, so that cracks are inevitably produced during immersion in the soldering bath, as mentioned previously. Recently, a proposal has been made for improving the phenolic resin, i.e. a curing agent for the epoxy resin composition to improve thermal resistance of the semiconductor encapsulating resin compositions. For example, a dicyclopentadiene-modified phenolic resin is proposed as a heat-resistant phenolic resin exhibiting superior moisture proofness in Japanese Laid-open Patent Application No. 63-110213 (1988). However, the dicyclopentadiene-modified resins are low in reactivity and inferior in moldability, while exhibiting a high softening temperature. Phenolic resins derived from norbornadiene, cyclopentadiene or cyclohexadiene as starting materials have also been proposed in Japanese Laid-open Patent Application No. 2-187422 (1990). However, the semiconductor encapsulating resin compositions employing these phenolic resins present problems in respect of hygroscopic properties such that it is not possible to prevent cracking completely during immersion in the soldering bath. As for the manufacture, with the above mentioned particular phenolic resins derived from dienes such as dicyclopentadiene, norbornadiene, cyclopentadiene or cyclohexadiene, a labor consuming operation is necessitated in removing unreacted feed materials or by-produced polymers of the above mentioned dienes, while the produced phenolic resins tend to be costly by reason of the above-mentioned manufacture problems.

SUMMARY OF THE INVENTION

It is an object of the present invention to provide a novel phenolic resin having excellent moisture proofness and workability, and a method for producing the resin.

It is another object of the present invention to provide a novel phenolic resin which, when used as a curing agent for an epoxy resin, exhibits high reactivity and a high curing rate and has a high glass transistion temperature.

It is yet another object of the present invention to provide an epoxy resin composition for encapsulation which is excellent in mechanical and electrical properties, moisture proofness and thermal resistance and which is not susceptible to cracking or degradation at an interface when subjected to acute changes in temperature.

The above and other objects of the invention will become apparent from the following description.

In accordance with the present invention, there is provided a phenolic resin represented by the formula (1)

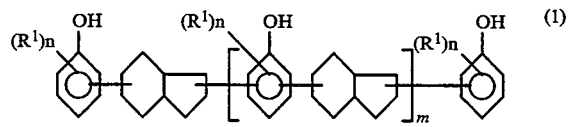

wherein $R^1$ denotes a hydrogen atom or an alkyl group having 1 to 4 carbon atoms, m denotes an integer of from 0 to 10 and n denotes 0, 1 or 2.

In accordance with the present invention, there is also provided a method for producing the aforementioned phenolic resin represented by the formula (1) comprising reacting in the presence of an acid catalyst 3a,4,7,7a-tetrahydroindene and a phenol represented by the formula (2)

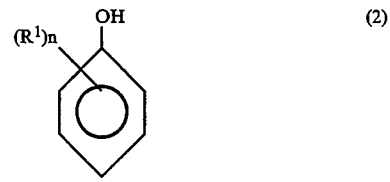

wherein $R^1$ denotes a hydrogen atom or an alkyl group having 1 to 4 carbon atoms and n denotes 0, 1 or 2.

In accordance with the present invention, there is also provided an epoxy resin composition for encapsulation comprising:
 (a) a curable epoxy resin,
 (b) the phenolic resin represented by the formula (1),
 (c) a curing promotor, and
 (d) an inorganic filler.

PREFERRED EMBODIMENTS OF THE INVENTION

Figure 1:
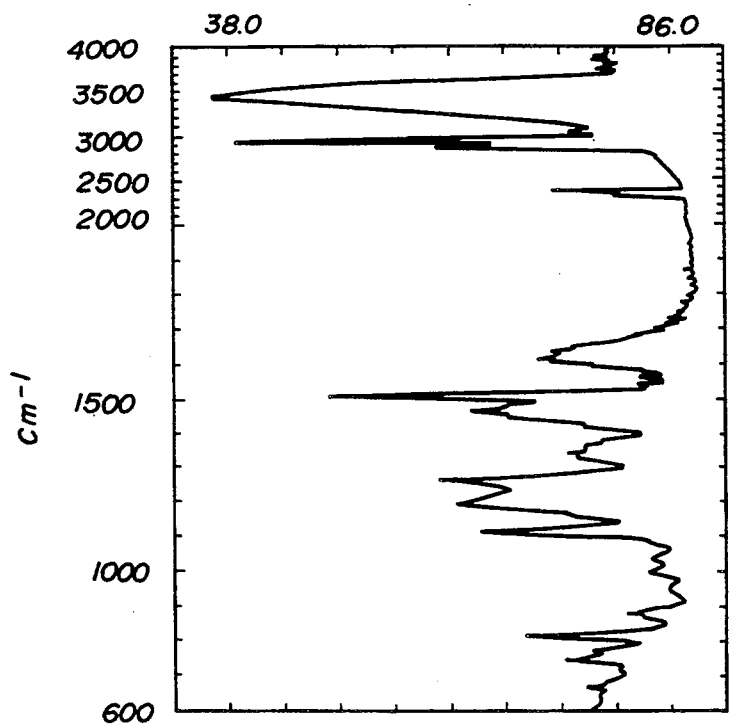
FIG. 1 is a chart showing an IR spectrum of a phenolic resin (I-1) of Example 1.

The present invention will be explained in more detail hereinbelow.

The phenolic resin of the present invention is a phenolic resin represented by the above formula (1). If, in this formula (1), $R^1$ denotes an alkyl group having 5 or more carbon atoms, m denotes a number not less than 11 and n denotes a number not less than 3, manufacture becomes difficult. The number average molecular weight of the phenolic resin may preferably be in a range of from 300 to 2000.

As the phenolic resins, compounds shown by the following formulas may be enumerated, wherein m denotes an integer in the range of from 0 to 10.

In the method for producing the phenolic resin according to the present invention, 3a, 4, 7, 7a-tetrahydroindene and the phenol represented by the formula (2) are reacted in the presence of an acid catalyst.

The tetrahydroindene employed as a starting material in the method of the present invention is a compound which may be easily produced by thermally isomerizing vinyl norbornene obtained by Diels-Alder reaction of butadiene and cyclopentadiene and which is by-produced in a known manner in a plant for producing ethylidene norbornene, that is a third component of an EPDM rubber (ethylene/propylene/diene/methylene rubber).

The phenol used as another starting material in the method of the present invention is a compound represented by the formula (2), and may preferably be enumerated by, for example phenol, o-cresol, m-cresol, p-cresol, t-butyl phenol, 2,6-dimethyl phenol and 2,5-dimethyl phenol. Above all, phenols, cresols and xylenols are preferred because of ease in purification of the produced resin and production costs.

The charging ratio when reacting the tetrahydroindene with the phenol may be such that 0.8 to 12 moles and preferably 1 to 5 moles of the phenol are charged to 1 mole of the tetrahydroindene. If the charging quantity of the phenol is less than 0.8 mole to 1 mole of tetrahydroindene, the phenolic resin having the desired molecular weight can not be obtained, whereas, if it exceeds 12 moles, a lot of labor is necessitated in removing unreacted monomers.

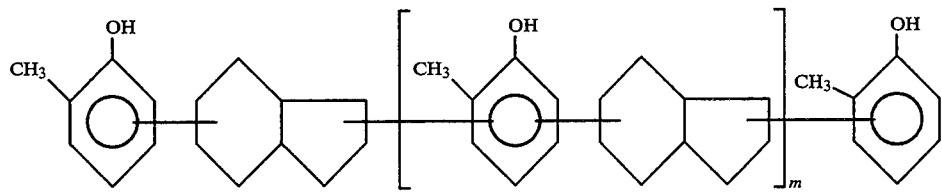

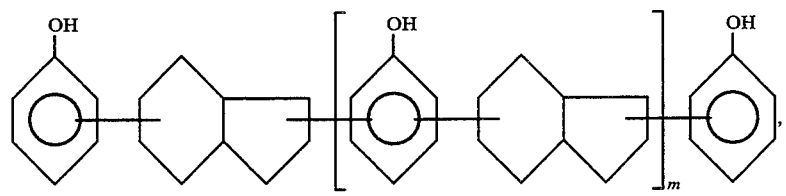

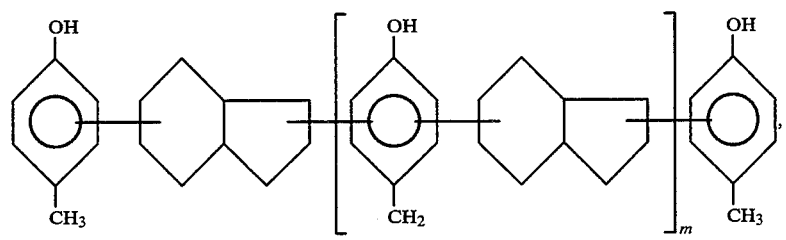

and

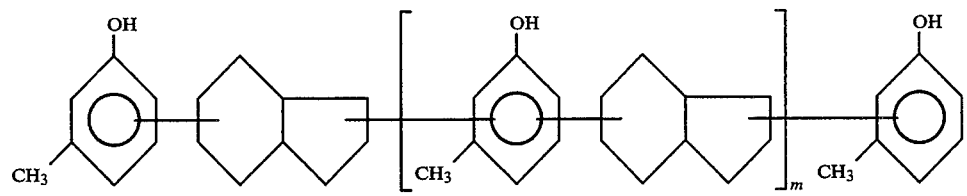

As the acid catalysts employed in the method of the present invention, boron trifluoride, boron trifluoride complexes, such as ether complexes, water complexes, amine complexes, phenol complexes or alcohol complexes of born trifluoride; aluminum compounds, such as aluminum trichloride or diethyl aluminum monochloride; iron chloride; titanium tetrachloride; sulfuric acid; hydrogen fluoride; trifluoromethane sulfonic acid; zeolite catalysts, solid acids composed of zeolite and metals, such as magnesium, calcium, strontium, barium, boron, aluminum, gallium, selenium, platinum, rhenium, nichel, cobalt, iron, copper, germanium, rhodium, osmium, iridium, molybdenum, tungsten, silver and mixtures thereof, or mixtures of the above compounds, may be enumerated. Above all, from the standpoint of activity and ease in removal of catalysts, boron trifluoride, boron trifluoride-ether complexes, boron trifluoride-phenol complexes, boron trifluoride-water complexes, boron trifluoride-alcohol complexes and boron trifluoride-amine complexes, are preferred, while boron trifluoride and boron trifluoride-phenol complexes are most preferred.

The amount of the acid catalyst may preferably be 0.1 to 20 parts by weight and more preferably 0.5 to 10 parts by weight to 100 parts by weight of tetrahydroindene, if the catalyst is a boron trifluoride-phenol complex. The amount may be varied depending on the type of acid catalysts employed.

The reaction of the method of the present invention may be carried out with or without a solvent. If the solvent is not used, the phenol may preferably be employed in an amount not less than an equivalent and, above all, in an amount of 3 to 5 time equivalents that of the tetrahydroindene. The solvent, if used, may be used without limitation unless it is hindersome to the reaction, and thus may preferably be enumerated by aromatic hydrocarbons, such as benzene, toluene or xylene. The solvent may preferably be used in an amount of 20 to 100 parts by weight to 100 parts by weight of the tetrahydroindene. The reaction temperature, which may be varied with the types of the acid catalysts, may preferably be 20° to 140° C. and more preferably 50° to 110° C. If the reaction is higher than 140° C., decomposition of the catalysts or secondary reactions may be produced, whereas, if the reaction temperature is lower than 20° C., the reaction is retarded to lower the economic profitability. The reaction time may preferably be in a range of from 2 to 5 hours.

For producing high polymeric phenol resins by the method of the present invention, it is preferred to reduce the moisture in the reaction system to as low a value as possible. Above all, it is preferred to maintain the moisture to not more than 100 ppm by weight. High molecular phenol resins may also be produced by adding the tetrahydroindene gradually in the course of the polymerization reaction.

In the method of the present invention, the phenol resin may be obtained by filtering or deactivating the catalyst after completion of the reaction and subsequently concentrating the resulting solution. Although the method for removing the catalyst is varied depending on the catalyst type, the boron trifluoride-phenol complex catalyst, for example may preferably be removed by deactivation by addition of calcium hydroxide or magnesium hydroxide in an amount of 1 to 10 moles to one mole of the catalyst, followed by catalyst filtration. When carrying out the filtration, it is preferred to add a solvent or to raise the filtrate temperature to improve workability.

The epoxy resin composition for encapsulation according to the present invention contains, as essential components, a curable epoxy resin as a component (a), the phenol resin of the formula (1) as a component (b), a curing promotor as a component (c) and an inorganic filler as a component (d).

The curable epoxy resin employed as the component (a) in the epoxy resin composition for encapsulation according to the present invention is a resin containing at least one and preferably two or more epoxy groups in the molecule, and may be enumerated by, for example an epoxy resin synthesized from epichlorohydrin and bisphenol A or novalak resin, an alicyclic epoxy resin, an epoxy resin into which halogen atoms, such as chlorine atoms or bromine atoms, are introduced, and polyfunctional epoxy resins. These may be used alone or in combination. As the component (a), commercially available products may be employed. For example, a novolak epoxy resin manufactured and sold by SUMITOMO CHEMICAL CO., LTD. under the trade name of "SUMIEPOXY ESCN-220 L" or a polyfunctional epoxy resin, such as "QUATREX 2410" manufactured by DOW CHEMICAL CO., "YDCN-702 P", or YDCN-703 S" manufactured by TOHTO KASEI CO., LTD., or "YX-4000" manufactured by YUKA SHELL EPOXY CO., LTD., may be employed.

The phenolic resin employed as the component (b) in the epoxy resin composition for encapsulation according to the present invention, is the phenolic resin represented by the formula (1).

As the curing promotor employed as the component (c) in the epoxy resin composition for encapsulation according to the present invention, a curing promotor which will promote the reaction between the epoxy group and the phenolic hydroxyl group, may be used, and may be enumerated by, for example tertiary phosphines, imidazoles and tertiary amines. Specifically, such tertiary phosphines may include phosphines represented by the formula (3)

 (3)

where $R^2$, $R^3$ and $R^4$ may be the same or different and each stand for a hydrogen atom, an alkyl group having 1 to 10 carbon atoms, or an aryl group. Examples of the tertiary phosphines include triethyl phosphine, tributyl phosphine and triphenyl phosphine.

The above mentioned tertiary amines may preferably be enumerated by diethyl ethanol amine, dimethyl benzyl amine, 2,4,6-tris(dimethylamine) phenol and 1,8-diazabicyclo[5,4,0]undecene. Imidazoles may preferably be enumerated by, for example 2-ethyl-4-methyl imidazole, 2,4-dimethyl imidazole, 2-methyl imidazole, 2-undecyl imidazole, 2-heptadecyl imidazole, 1-vinyl-2-methyl imidazole, 1-propyl-2-methyl imidazole, 2-isopropyl imidazole, 1-cyanoethyl-2-ethyl imidazole, 1-cyanoethyl-2-ethyl-4-methyl imidazole, 1-cyanoethyl-2-undecyl imidazole, 1cyanoethyl-2-phenyl imidazole, 2-phenyl imidazole, 1-benzyl-2-methyl imidazole, 2-phenyl-4-methyl imidazole, 2-phenyl-4,5-dihydroxymethyl imidazole and 2-phenyl-4-methyl-5-hydroxymethyl imidazole. The component (c) may be enumerated most preferably by 2-methyl imidazole (2 Mz), 1,8-diaza bicyclo[5,4,0]undecene (DBU), triphenyl phosphine (TPP), dimethyl benzyl amine (BDMA) and mixtures thereof.

As the inorganic filler of the component (d) of the epoxy resin composition for encapsulation according to the present invention, a silica powder filler, for example may preferably be employed.

The components (a) to (d) employed in the epoxy resin composition for encapsulation according to the present invention may be used in such amounts that preferably 40 to 180 parts by weight and more preferably 50 to 120 parts by weight of the component (b) and preferably 0.01 to 5.0 parts by weight and more preferably 0.5 to 3.0 parts by weight of the component (c) are used to 100 parts by weight of the component (a), and preferably 50 to 90 wt % and more preferably 65 to 85 wt % of the component (d) are used based on the total weight of the epoxy resin composition for encapsulation.

Although the epoxy resin composition for encapsulation according to the present invention contains the components (a) to (d) as essential components, phenolic resins other than the component (b) may also be employed in addition to the component (b), if needed. The phenolic resins other than the component (b) may include, for example, "TAMANOL-758" and "TAMANOL-759" (trade names) manufactured by ARAKAWA KAGAKU KOGYO KK, a novolak type phenol resin manufactured and sold by CIBA GEIGY INC. under the trade name of "ENC-1280", brominated novolak type phenol resins, and polyphenol compounds, such as polyvinyl phenol, brominated polyvinyl phenol or tetrabromobisphenol A. The phenol resins other than the component (b) may preferably be used in an amount of not more than 100 parts by weight and, above all, not more than 50 parts by weight to 100 parts by weight of the component (b). The amount in excess of 100 parts by weight is not desirable because moisture proofness is deteriorated. Various additives, such as silane coupling agents, inflammation retarders such as brominated epoxy resins, antimony trioxide or hexabromobenzene, colorants such as carbon black or red iron oxide, mold release agents such as natural wax or synthetic wax, or low stress additives, such as silicon oil or rubber, may be suitably added to the epoxy resin composition for encapsulation.

For preparing a molding material using the epoxy resin composition for encapsulation according to the present invention, the epoxy resin, the phenolic resin, the curing promotors, the inorganic filler and other additives may be mixed thoroughly and uniformly by a mixer and the resulting mixture may then be melted and kneaded by a heated roll or a kneader before cooling and pulverization.

The phenolic resin of the present invention has low content of hydroxyl groups so that a cured product obtained using the phenolic resin is excellent in moisture proofness. Besides, the phenolic resin is low in bulkiness of the hydrophobic groups around the hydroxyl groups and hence superior in reactivity. It also exhibits moderate reactivity, moisture-proofness, workability and economic profitability which are well balanced so that it exhibits most desirable properties as a curing agent for the epoxy resin composition for encapsulation. The resin may be used not only for encapsulation but as a laminated plate for a printed circuit board, a powdered paint or a brake shoe. Since the hydroxyl groups of the phenolic resin are excellent in reactivity, the resin may be glycidylated to an epoxy resin so as to be used for encapsulation or as a powdered paint or a solder resist. The epoxy resin may be rendered photosensitive by addition of (meth)acrylic acid thereto for use as a coating agent, a photoetching resist or a photosolder resist. Besides, the produced (meth)acrylic addition product may also be reacted with α, δ-acid anhydrides so as to be solubilized in an alkaline aqueous solution for use as an alkali developable photosolder resist or a photoetching resist.

With the above described method for producing the phenolic resin according to the present invention, the phenolic resin may be produced at a high yield using industrially inexpensive starting materials, namely 3a,4,7,7a-tetrahydroindene and phenols. Besides, since 3a,4,7,7a-tetrahydroindene is thermally stable and is hardly homopolymerizable with an acid catalyst, the produced phenolic resin may be purified easily.

In addition, since the above mentioned phenolic resin having superior moisture proofness and reactivity is used as a curing agent for the epoxy resin composition for encapsulation according to the present invention, the resin composition has a high curing rate and the cured product may have a high glass transition point Tg. Besides, since the resin composition has a low melting viscosity, it is superior in workability and it becomes possible to increase the amount of addition of the inorganic filler. The molding material produced from the epoxy resin composition for encapsulation according to the present invention is superior in mechanical and electrical properties, thermal resistance, moisture proofness and resistance to cracking, so that it may be used for encapsulation, coating or insulation. Semiconductor packages obtained on curing the above composition are excellent in thermal resistance, so that there is no risk of cracking of the molded resin or deterioration of the lead wire resin interface regions.

EXAMPLES OF THE INVENTION

The present invention will be explained with reference to several Examples, which, however, are given for illustration only and are not intended for limiting the invention.

EXAMPLE 1

To a reactor fitted with a reflux cooler and a Liebig condenser, 1512 g of o-cresol and 300 g of toluene were charged and heated to 170° C. for distilling 250 g of toluene and dehydrating until 60 ppm of residual water in the reaction system were reached. The system was then cooled to 80° C. and 35 g of a boron trifluoride-phenol complex were added thereto. After homogenization, 360 g of 3a,4,7,7a-tetrahydroindene having a water concentration of 20 ppm were added dropwise gradually over 1.5 hours at a reaction temperature of 80° C. After the end of the reaction, 80 g of a magnesium compound manufactured and sold by KYOWA KAGAKU KOGYO KK under the trade name of "KW-1000" were added and agitated for 30 minutes for deactivating the catalyst. The reaction solution was filtered using a filter paper on the entire surface of which cerite was laid. The produced transparent filtrate was distilled under vacuum at 230° C. to produce 560 g of a phenolic resin I-1.

The produced phenolic resin I-1 had a softening point of 85° C. The amount of the phenol-derived hydroxyl groups, as found by back titration following acetylation with acetic anhydride, was 530 mmol per 100 g of the resin. The $^1$H-NMR analyses indicated that protons coupled to an aromatic ring were observed at δ6.5 to 7.5 ppm, while protons of a naphthenic ring and methyl groups coupled to the aromatic ring were observed at δ0.8 to 2.5 ppm but absorption of the protons coupled to the double bonds was not noticed. The amount of the phenol-derived hydroxyl groups, as found from the δ6.5 to 8 ppm and δ0.8 to 2.5 ppm peak area ration was 500 mmols per 100 g of the resin, which is approximately equal to the above value. The number average molecular weight, as found by analyses by gel permeation chromatography (GPM), was 580. The produced phenolic resin was found to be a mixture of the formula (1) where m is 0 to 10, while the mean polymerization degree was 1.1, as found from the number average molecular weight. The produced phenolic resin I-1 is shown by the formula

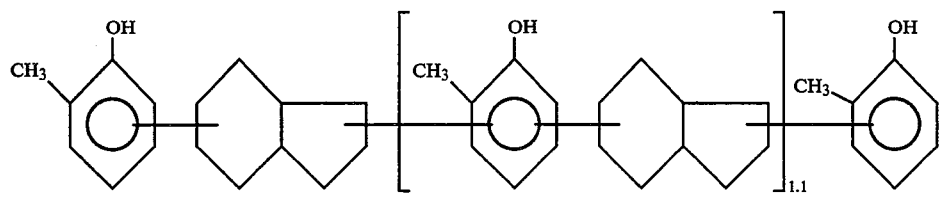

Figure 3:
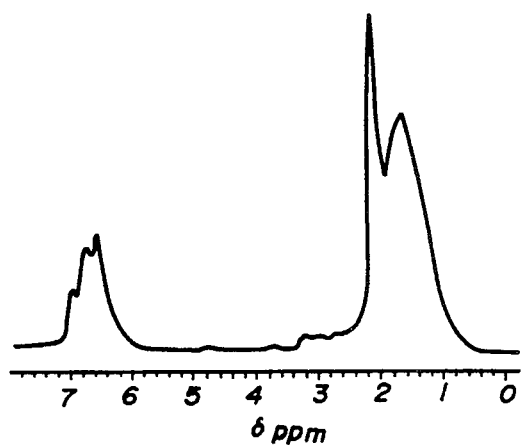
FIG. 3 is a chart showing a $^1$H-NMR spectrum of the phenolic resin (I-2) of Example 1.
Figure 5:
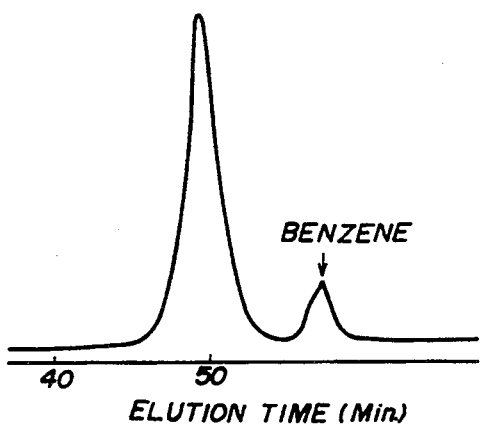
FIG. 5 is a chart showing a gel permeation chromatography of the phenolic resin (I-1) of Example 1.

The IR chart, ¹H-NMR chart and the GPC chart are shown in FIGS. 1, 3 and 5, respectively.

EXAMPLE 2

560 g of a phenolic resin I-2 were obtained in the same way as in Example 1, except using 1600 g of phenol in place of o-cresol.

The produced phenolic resin I-2 had a softening point of 95° C. The amount of the phenol-derived hydroxyl groups, as found by back titration following acetylation with acetic anhydride, was 550 mmol per 100 g of the resin. The ¹H-NMR analyses indicated that protons coupled to an aromatic ring were observed at δ6.5 to 7.5 ppm, while protons of a naphthenic ring were observed at δ0.8 to 2.5 ppm but absorption of protons coupled to the double bonds was not observed. The amount of the phenol-derived hydroxyl groups, as found from the δ6.5 to 7.5 ppm and δ0.8 to 2.5 ppm peak area ratio, was 550 mmols per 100 g of the resin, which is approximately equal to the above value. The number average molecular weight, as found by analyses by gel permeation chromatography (GPM), was 560. The produced phenolic resin was found to be a mixture of the formula (1) where m is 0 to 10, while the mean polymerization degree was 1.1, as found from the number average molecular weight. The produced phenolic resin I-2 is shown by the formula

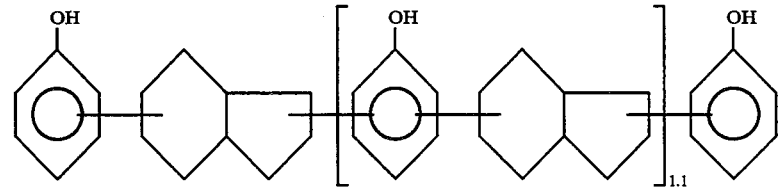

Figure 2:
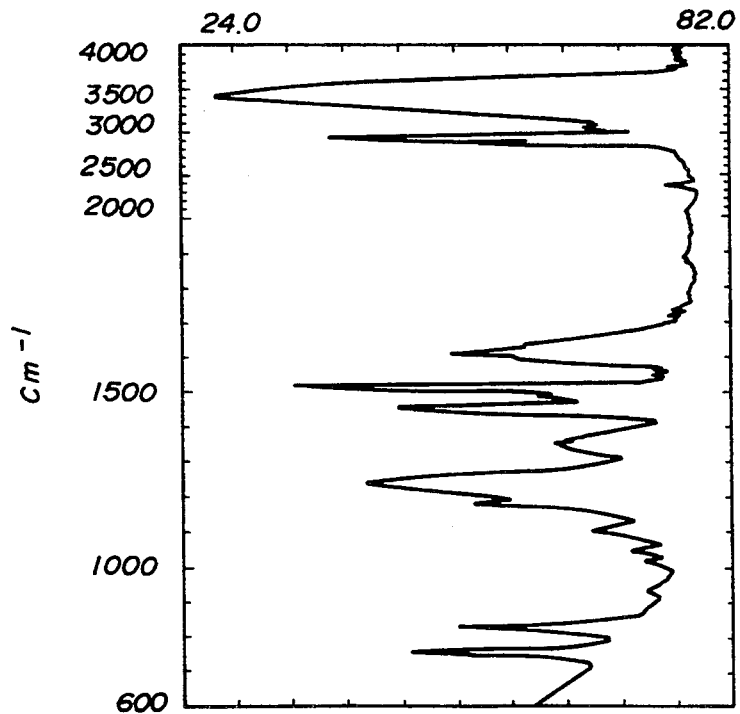
FIG. 2 is a chart showing an IR spectrum of a phenolic resin (I-2) of Example 2.
Figure 4:
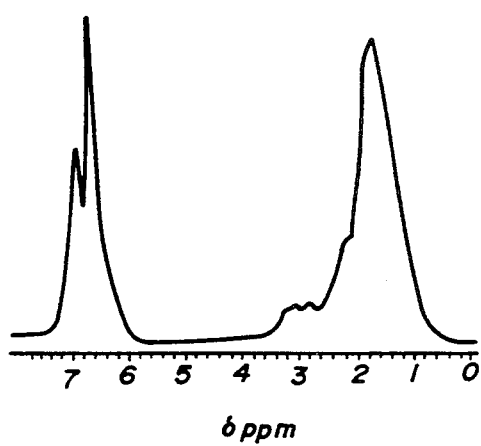
FIG. 4 is a chart showing a $^1$H-NMR spectrum of the phenolic resin (I-2) of Example 2.
Figure 6:
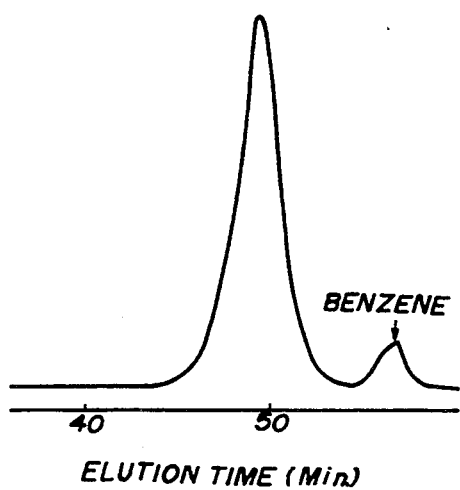
FIG. 6 is a chart showing a gel permeation chromatography of the phenolic resin (I-2) of Example 2.

The IR chart, ¹H-NMR chart and the GPC chart are shown in FIGS. 2, 4 and 6, respectively.

EXAMPLE 3

60 g of the phenolic resin I-1, produced in Example 1, 9 g of "TAMANOL-759", a trade name of a novolak phenolic resin produced by ARAKAWA KAGAKU KK, 82 g of "SUMIEPOXY ESCN-220 L", a trade name of a novolak epoxy resin manufactured by SUMITOMO CHEMICAL CO., LTD., 353 g of "FUSEREX RD-8", a trade name of melted powdered silica manufactured by TATSUMORI KK, and additives shown in Table 1, were mixed uniformly by a mixer to produce an epoxy resin composition for encapsulation, which was melted and kneaded at 85° C. for ten minutes by a kneader and subsequently cooled and pulverized to obtain an epoxy resin molding material.

The produced powdered molding material was formed into tablets which were used for encapsulating test elements using a transfer molding machine under the conditions of 175° C., 70 kg/cm² and 120 seconds. The encapsulated products were then cured under conditions of 180° C. and 5 hours. 6×6 mm chips were encapsulated to give a 52P package for testing solder cracking, while 3×6 mm chips were encapsulated to give a 16pSOP package for solder moisture proofness testing. The encapsulated test elements were put to the following solder cracking tests and solder moisture-proofing tests. The results are shown in Table 1.

The solder cracking test: The encapsulated test elements were processed for 48 and 72 hours in an environment of 85° C. and 85% RH, and subsequently immersed for 10 seconds in a soldering bath maintained at 280° C., after which the test elements were checked as to external cracks with a microscope.

Solder Moisture Proofness Test: The encapsulated test elements were processed for 48 and 72 hours in an environment of 85° C. and 85% RH, and subsequently immersed for 10 seconds in a soldering bath maintained at 280° C., after which a pressure cooker test was conducted at 125° C. and 100% RH to measure the time until 50%-circuit oven failure occurred.

EXAMPLE 4

A molding material was produced in the same way as in Example 3, except using the phenolic resin I-2 produced in accordance with Example 2. The results are shown in Table 1.

COMPARATIVE EXAMPLE 1

A molding material was produced in the same way as in Example 3, except substituting only a phenol novolak resin for the phenolic resin and using a composition shown in Table 1. The results are shown in Table 1.

TABLE 1

| | Ex. 3 | Ex. 4 | Comp. Ex. 1 |
|---|---|---|---|
| Cresol novolak type epoxy resin (g) | 82 | 82 | 68 |
| Phenol novolak resin (g) | 9 | 9 | 32 |
| Phenolic resin (I-1) (g) | 60 | — | — |
| Phenolic resin (I-2) (g) | — | 60 | — |
| Added Amount | | | |
| Triphenyl phosphine (g) | 0.2 | 0.2 | 0.2 |
| Carnauba wax (g) | 0.5 | 0.5 | 0.5 |
| Antimony trioxide (g) | 8 | 8 | 8 |
| Carbon black (g) | 0.5 | 0.5 | 0.5 |
| Coupling agent (g) | 0.5 | 0.5 | 0.5 |
| Melted powdered silica (g) | 353 | 353 | 235 |
| Characteristics | | | |
| Glass transition point (°C.) | 150 | 153 | 160 |
| Flexural elastic modulus (kg/mm$^2$) | 1150 | 1250 | 1400 |
| Solder moisture proof average life (h) | 300< | 300< | 100 |
| Solder cracking test (number of cracks/ total number) | 0/16 | 0/16 | 16/16 |

Tg; found by TMA method
Flexural Elastic Modulus; found by JIS-K-6911

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. An epoxy resin composition for encapsulation comprising:
   (a) a curable epoxy resin,
   (b) a phenolic resin of the formula (1)

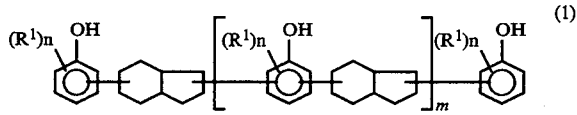

wherein $R^1$ denotes a hydrogen atom or an alkyl group having 1 to 4 carbon atoms, m denotes an integer of from 0 to 10 and n denotes 0, 1 or 2,
   (c) a curing promotor, and
   (d) an inorganic filler.

2. An epoxy resin composition for encapsulation as claimed in claim 1 wherein said curable epoxy resin is selected from the group consisting of an epoxy resin synthesized from epichlorohydrin and bisphenol A, an epoxy resin synthesized from epichlorohydrin and a novolak resin, an alicyclic epoxy resin, an epoxy resin with an halogen atom introduced therein, a polyfunctional epoxy resin, and mixtures thereof.

3. An epoxy resin composition for encapsulation as claimed in claim 1 wherein said curing promotor is selected from the group consisting of tertiary phosphines, imidazoles, tertiary amines and mixtures thereof.

4. An epoxy resin composition for encapsulation as claimed in claim 3 wherein said tertiary phosphine is selected from the group consisting of triethyl phosphine, tributyl phosphine, triphenyl phosphine and mixtures thereof.

5. An epoxy resin composition as claimed in claim 3 wherein said tertiary amine is selected from the group consisting of diethyl ethanol amine, dimethyl benzyl amine, 2,4,6-tris(dimethylamino) phenol, 1,8-diazabicyclo[5,4,0]undecene and mixtures thereof.

6. An epoxy resin composition for encapsulation as claimed in claim 3 wherein said imidazole is selected from the group consisting of 2-ethyl-4-methyl imidazole, 2,4-dimethyl imidazole, 2-methyl imidazole, 2-undecyl imidazole, 2-heptadecyl imidazole, 1-vinyl-2-methyl imidazole, 1-propyl-2-methyl imidazole, 2-isopropyl imidazole, 1-cyanoethyl-2-ethyl imidazole, 1-cyanoethyl-2-ethyl-4-methyl imidazole, 1-cyanoethyl-2-undecyl imidazole, 1-cyanoethyl-2-phenyl imidazole, 2-phenyl imidazole, 1-benzyl-2-methyl imidazole, 2-phenyl-4-methyl imidazole, 2-phenyl-4,5-dihydroxymethyl imidazole, 2-phenyl-4-methyl-5-hydroxymethyl imidazole, and mixtures thereof.

7. An epoxy resin composition for encapsulation as claimed in claim 1 wherein said inorganic filler is a silica powder filler.

8. An epoxy resin composition as claimed in claim 1 wherein an amount of the phenolic resin and an amount of the curing promotor to 100 parts by weight of the curable epoxy resin are 40 to 180 parts by weight and 0.01 to 5.0 parts by weight, respectively, and wherein an amount of the inorganic filler is 50 to 90 wt % based on the total weight of the epoxy resin composition for encapsulation.

9. An epoxy resin composition as claimed in claim 1 further comprising an additional phenolic resin.

10. An epoxy resin composition for encapsulation as claimed in claim 9 wherein said additional phenolic resin is selected from the group consisting of a novolak phenolic resin, a brominated novolak phenolic resin, polyvinyl phenol, brominated polyvinyl phenol, tetrabromo bisphenol A and mixtures thereof.

11. An epoxy resin composition as claimed in claim 1 further comprising an additive selected from the group consisting of a silane coupling agent, an inflammation retarder, a colorant, a mold release agent, a low stress additive, and mixtures thereof.

* * * * *